United States Patent
Otake et al.

(10) Patent No.: US 7,629,214 B2
(45) Date of Patent: Dec. 8, 2009

(54) METHOD OF MAKING A TRANSISTOR WITH A SLOPED DRAIN DIFFUSION LAYER

(75) Inventors: Seiji Otake, Saitama (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 294 days.

(21) Appl. No.: 11/392,779

(22) Filed: Mar. 28, 2006

(65) Prior Publication Data

US 2006/0223259 A1    Oct. 5, 2006

(30) Foreign Application Priority Data

Mar. 30, 2005    (JP)    ............................ P2005-098968

(51) Int. Cl.
*H01L 21/8244* (2006.01)
(52) U.S. Cl. ................ 438/224; 438/514; 257/E29.005
(58) Field of Classification Search .............. 438/358, 438/279, 301, 302, 224, 514, 517–519; 257/197, 257/192, 194, 200, 335, 338, E21.334, E21.336, 257/E21.473, E29.005
See application file for complete search history.

(56) References Cited

U.S. PATENT DOCUMENTS

| 6,768,173 | B2 * | 7/2004 | Hebert ........................ 257/345 |
| 2002/0074612 | A1 | 6/2002 | Bulucea et al. |
| 2003/0127689 | A1 | 7/2003 | Hebert |
| 2006/0220125 | A1 | 10/2006 | Otake et al. |

FOREIGN PATENT DOCUMENTS

| JP | 04-103161 | 4/1992 |
| JP | 11-289088 | 10/1999 |
| JP | 2001-250941 | 9/2001 |
| JP | 2002-083941 | 3/2002 |
| JP | 2003-197791 | 7/2003 |
| JP | 2004-104141 | 4/2004 |
| KR | 1995-0007345 | 3/1992 |
| KR | 10-0385764 | 5/2003 |
| KR | 2003-0057447 | 7/2003 |

OTHER PUBLICATIONS

Office action dated Dec. 31, 2007 for U.S. Appl. No. 11/393,530.
Office action dated Jun. 26, 2008 for U.S. Appl. No. 11/393,530.
Office action dated Nov. 17, 2008 for U.S. Appl. No. 11/393,530.

* cited by examiner

*Primary Examiner*—Davienne Monbleau
*Assistant Examiner*—Hoa B Trinh
(74) *Attorney, Agent, or Firm*—Fish & Richardson P.C.

(57) ABSTRACT

Disclosed is that in a method of manufacturing a semiconductor device of the present invention, when first and second P type diffusion layers using as a backgate region, these layers are formed in such a way that their impurity concentration peaks are shifted, respectively. Then, in the backgate region, a concentration profile of a region where an N type diffusion layer is formed is gradually established. After that, impurity ions, which form the N type diffusion layer, are implanted, and thereafter a thermal treatment is performed to diffuse the N type diffusion layer in a y shape at a lower portion of a gate electrode. This manufacturing method makes it possible to implement an electric filed relaxation in a drain region.

6 Claims, 9 Drawing Sheets

METHOD OF MAKING A TRANSISTOR WITH A SLOPED DRAIN DIFFUSION LAYER

Priority is claimed to Japanese Patent Application Number JP2005-098968 filed on Mar. 30, 2005, the disclosure of which is incorporated herein by reference in its entirety.

BACKGROUND OF THE INVENTION

1. Field of the Invention

The present invention relates to a manufacturing method of a semiconductor device for reducing a film thickness of a gate oxide film to relax an electric field in a drain region.

2. Description of the Related Art

In conventional methods of manufacturing a semiconductor device, for example, the following technique is known. A gate oxide film is formed on a P type silicon substrate. A gate electrode formed of polysilicon is formed on the gate oxide film. Then, arsenic ions are implanted into the substrate using the gate electrode by a self-alignment technique to form a low concentration diffusion layer with an LDD (Lightly Doped Drain) structure. Thereafter, a side wall spacer is formed on a side surface of the gate electrode to form a high concentration diffusion layer with an LDD structure. This manufacturing method forms a semiconductor device including a gate oxide film with high insulation properties and reliability. This technology is described for instance in Japanese Patent Application Publication No. Hei 11(1999)-2890088.

In conventional methods of manufacturing a semiconductor device, for example, the following technique is known. A gate oxide film is formed on a semiconductor layer to deposit a polysilicon film on the gate oxide film. Then, the polysilicon film is selectively removed to form a gate electrode on the gate oxide film. Next, the gate oxide film is selectively removed by etching using the gate electrode as a mask. At this time, an etchant penetrates into a lower side of an end portion of the gate electrode to remove the gate oxide film. Then, a thermal oxidization is carried out to form an oxide film on an exposed portion of the semiconductor layer. Thereafter, a source region with a DDD (Double Diffusion Drain) structure and a drain region are formed by a self-aligning technique using the gate electrode. This manufacturing method forms a semiconductor device that realizes an electric field relaxation in the drain region. This technology is described for instance in Japanese Patent Application Publication No. 2001-250941.

In conventional methods of manufacturing a semiconductor device, for example, the following technique is known. A sacrificial oxide film of about 100 nm is first formed on the upper surface of the substrate in forming a high voltage circuit and a low voltage circuit on the same substrate. In a region where the high voltage circuit is formed, impurity ions are implanted into an upper surface of the sacrificial oxide film at an acceleration voltage of about 150 keV. Then, a well region is formed in a region where a PMOS transistor of the high voltage circuit or the like is formed. After that, the sacrificial oxide film is removed and a first gate oxide film of about 13 nm is formed on an upper surface of a substrate of a region where both circuits are formed. Next, a well region is formed in a region where a PMOS transistor of the low voltage circuit is formed. After that, a second gate oxide film of about 8 nm is formed on the upper surface of the substrate of the region where both circuits are formed, so that PMOS transistors of both circuits are formed. This technology is described for instance in Japanese Patent Application Publication No. 2004-104141.

As explained above, in the conventional method of manufacturing a semiconductor device, the drain region is formed to have the LDD structure, thereby realizing the electric field relaxation in the drain region. For this reason, first, the low concentration drain region, which makes the drain region, is formed by the self-alignment technique using the gate electrode. Next, the side wall spacer is formed on the side surface of the gate electrode. Then, the high concentration drain region is formed by the self-alignment technique using the side wall spacer. However, in this manufacturing method, a process for forming the side wall spacer is needed to form the LDD structure. This causes a problem in which the number of masks and that of manufacturing processes are increased to require a high manufacturing cost. Moreover, there is a problem in which the manufacturing process becomes complicated.

Moreover, in the conventional method of manufacturing a semiconductor device, when the drain region is formed to have the DDD structure, the gate oxide film, which is positioned between the gate electrode and the drain region, is thickly formed. In this manufacturing method, after the gate oxide film and the gate electrode are formed on the semiconductor layer, the gate oxide film is removed by etching using the gate electrode as a mask. After that, a thermal oxidation process is needed to increase the film thickness of the gate oxide film between the gate electrode and the drain electrode. However, this manufacturing method causes a problem in which the number of manufacturing processes is increased, resulting in an increase in manufacturing cost. Moreover, there is a problem in which the manufacturing process becomes complicated.

Moreover, in the conventional method of manufacturing a semiconductor device, in order to form a CMOS transistor on the same substrate, an N type well region is formed and thereafter a P type well region is formed in the N type well region. Then, in both well regions, impurity ions are implanted into a channel region to adjust an impurity concentration of a surface region of the semiconductor layer for the purpose of suppressing a short channel effect. Thereafter, a source region and a drain region are formed in both well regions, respectively. However, in this manufacturing method, the impurity concentration of the region where the drain region is formed is relatively high, so that the drain region is less likely to be widely diffused in the channel direction and the depth direction. This increases an electron current density in the drain region, resulting in a structure in which a parasitic NPN transistor is easily turned on. Then, there is a problem in which a withstand voltage characteristic deteriorates when the semiconductor device is turned on.

SUMMARY OF THE INVENTION

In view of the aforementioned circumstances, a method of manufacturing a semiconductor device of the present invention includes the steps of forming a backgate diffusion layer on a semiconductor layer and then forming a gate oxide film and a gate electrode on the semiconductor layer, and implanting impurity ions into the backgate diffusion layer and thereafter diffusing the impurity ions thereinto to form a source diffusion layer and a drain diffusion layer, in which in the step of forming the drain diffusion layer, the drain diffusion layer is formed in order that the drain diffusion layer has a slope relative to a surface of the semiconductor layer and an angle formed by a tangent line of the slope and the surface of the semiconductor layer gets smaller toward the surface of the semiconductor layer. Accordingly, in the present invention, the drain diffusion layer is widely diffused as it approaches to the surface of the semiconductor layer. Then, in the drain diffusion layer, an impurity concentration in the vicinity of the surface of the semiconductor surface becomes low. This manufacturing method makes it possible to realize an electric field relaxation in the drain diffusion layer while reducing the number of masks and that of manufacturing processes to suppress the manufacturing cost.

Moreover, according to the method of manufacturing a semiconductor device of the present invention, in the step of forming the backgate diffusion layer, a first diffusion layer having a peak of an impurity concentration located at a deeper portion of the semiconductor layer is formed, and thereafter a second diffusion layer having a peak of an impurity concentration closer to the surface of the semiconductor layer than the peak of the impurity concentration of the first diffusion layer, is formed in a way that the first and second diffusion layers are overlapped. Accordingly, in the present invention, the second diffusion layer is formed on the first diffusion layer to form the backgate diffusion layer. This manufacturing method can form the backgate diffusion layer that can realize a concentration profile in which the impurity concentration reaches the peak at the deeper portion and gradually decreases as it approaches to the surface of the semiconductor layer.

Furthermore, according to the method of manufacturing a semiconductor device, in the step of forming the drain diffusion layer, after the second diffusion layer is formed, the drain diffusion layer is formed by use of the gate electrode as a mask. Accordingly, in the present invention, a low concentration region of the drain diffusion layer can be formed with a high accuracy of position to the gate electrode. This manufacturing method can realize an electric field relaxation in the drain region.

Still furthermore, according to the method of manufacturing a semiconductor device of the present invention, the gate oxide film is formed to have a thickness of 50 to 340 Å. Accordingly, in the present invention, the thickness of the gate oxide film is reduced, thereby enabling an operation to be performed at a low driving voltage.

DETAILED DESCRIPTION OF THE PREFERRED EMBODIMENTS

The following will specifically explain a method of manufacturing a semiconductor device of an embodiment of the present invention with reference to FIGS. 1 to 8. FIGS. 1 to 8 are cross sectional views each explaining the method of manufacturing a semiconductor device according to the embodiment of the present invention. Although the following explains a case in which, for example, an N-channel type MOS transistor is formed in one device forming region divided by an isolation region, the embodiment of the present invention is not limited to this case. For example, the embodiment of the present invention may be applied to a case in which a P-channel type MOS transistor, an NPN type transistor and a vertical PNP transistor are formed in the other device forming region to form a semiconductor integrated circuit device.

Figure 1:
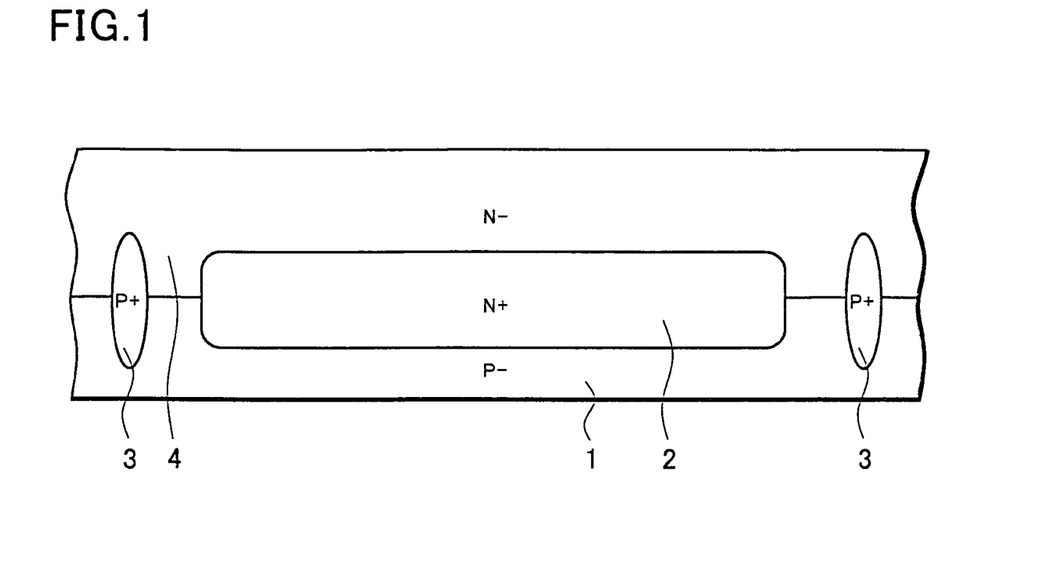
FIG. 1 is a cross-sectional view explaining a method of manufacturing a semiconductor device according to an embodiment of the present invention.

First of all, as illustrated in FIG. 1, a P type monocrystalline silicon substrate 1 is prepared. An N type impurity, for example, phosphorus (P) ions are implanted into a surface of the substrate 1 to form an N type buried diffusion layer 2 by a well known photolithographic technique. Next, a P type impurity, for example, boron (B) ions are implanted into the surface of the substrate 1 to form a P type buried diffusion layer 3 by the well known photolithographic technique. Thereafter, the substrate 1 is placed on a susceptor of an epitaxial growth device. Then, the substrate 1 is heated at a high temperature of, for example, about 1200° C. while an SiHCl$_3$ gas and an H$_2$ gas are introduced into a reaction tube. An epitaxial layer 4, which has, for example, a specific resistance of 0.1 to 2.0 Ω cm and a thickness of about 1.5 to 10.0 μm, is grown on the substrate 1 by this process.

It is noted that the substrate 1 and the epitaxial layer 4 of the present embodiment correspond to "a semiconductor layer" of the present invention. Then, although the present embodiment shows the case in which the epitaxial layer 4 is formed on the substrate 1, the embodiment of the present invention is not limited to this case. For example, "the semiconductor layer" of the present invention may be only the substrate or one in which a plurality of epitaxial layers are layered on an upper surface of the substrate. Also, the substrate may be an N type monocrystalline silicon substrate and a compound semiconductor substrate.

Figure 2:
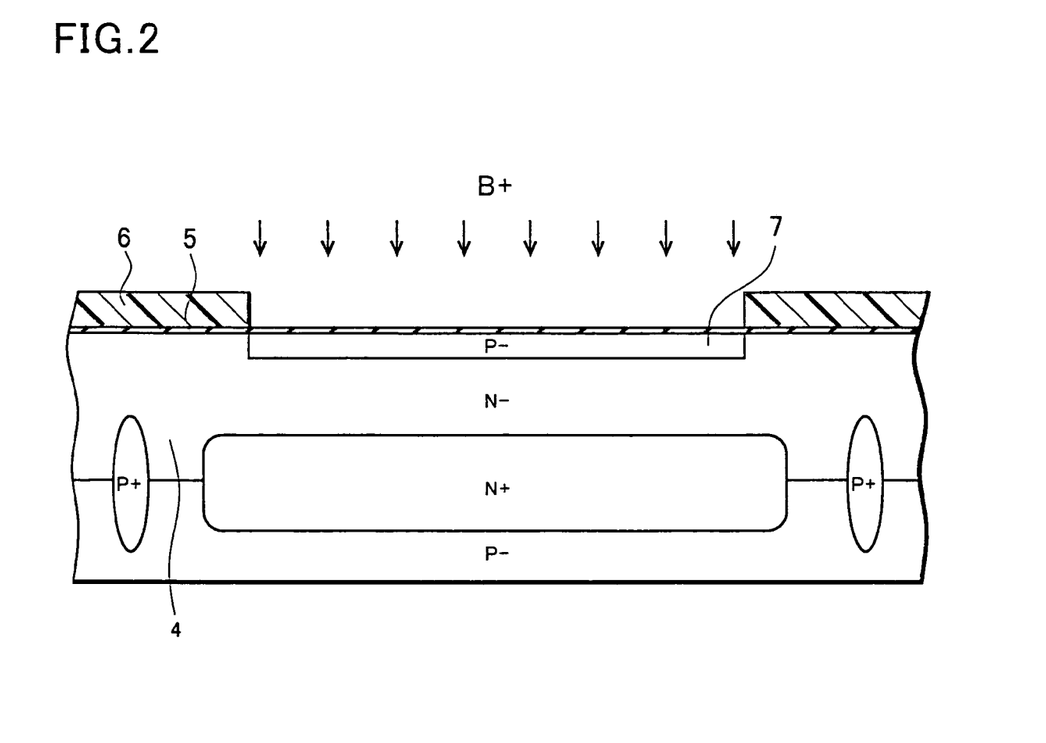
FIG. 2 is a cross-sectional view explaining the method of manufacturing a semiconductor device according to the embodiment of the present invention.

Next, as illustrated in FIG. 2, a silicon oxide film 5 of about 400 to 600 Å is deposited on the epitaxial layer 4. A photoresist 6 is formed on the silicon oxide film 5. Then, an opening is formed on the photoresist 6 on a region where a P type diffusion layer 7 is formed by the well known photolithographic technique. After that, a P type impurity such as boron (B) ions are implanted to form the P type diffusion layer 7.

At this time, in the present embodiment, boron (B) ions are implanted at an acceleration voltage of 140 to 180 keV and with a dose of $1.0 \times 10^{11}$ to $1.0 \times 10^{13}/cm^2$. Then, after the photoresist 6 is removed, the impurity ions which have been implanted are diffused. According to this manufacturing method, the P type diffusion layer 7 has a peak of the impurity concentration located at a deeper portion of the epitaxial layer 4.

Figure 3:
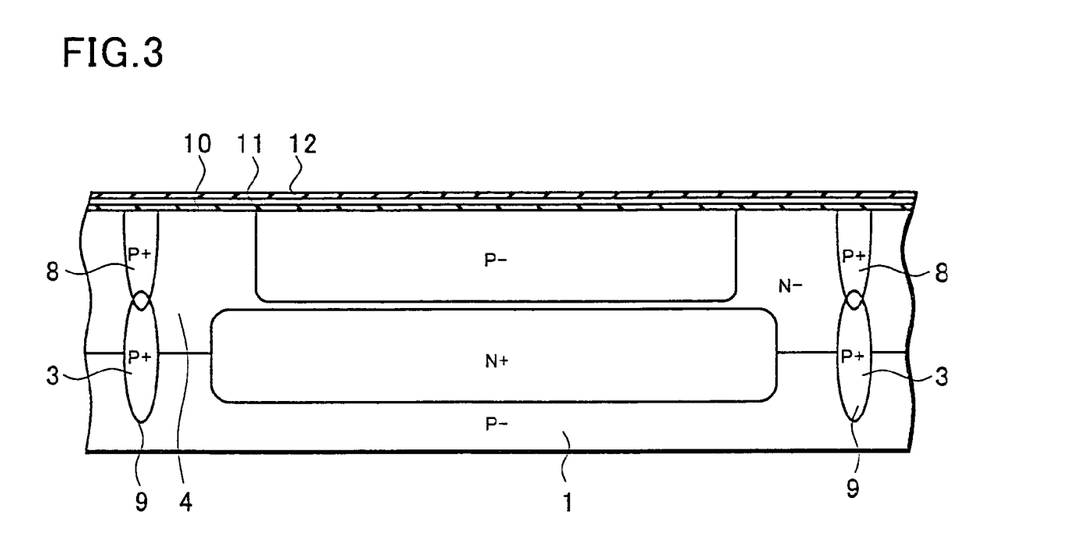
FIG. 3 is a cross-sectional view explaining the method of manufacturing a semiconductor device according to the embodiment of the present invention.

Next, as illustrated in FIG. 3, after the silicon oxide film 5 is removed, a P type impurity such as boron (B) ions are implanted into the surface of the epitaxial layer 4 to form a P type diffusion layer 8 by the well known photolithographic technique. Then, the P type buried diffusion layer 3 and the P type buried layer 8 are connected to form an isolation region 9. As mentioned above, the substrate 1 and the epitaxial layer 4 are divided into multiple island regions by the isolation region 9. After that, a silicon oxide film 10, a polysilicon film 11, and a silicon nitride film 12 are sequentially formed on the epitaxial layer 4.

Figure 4:
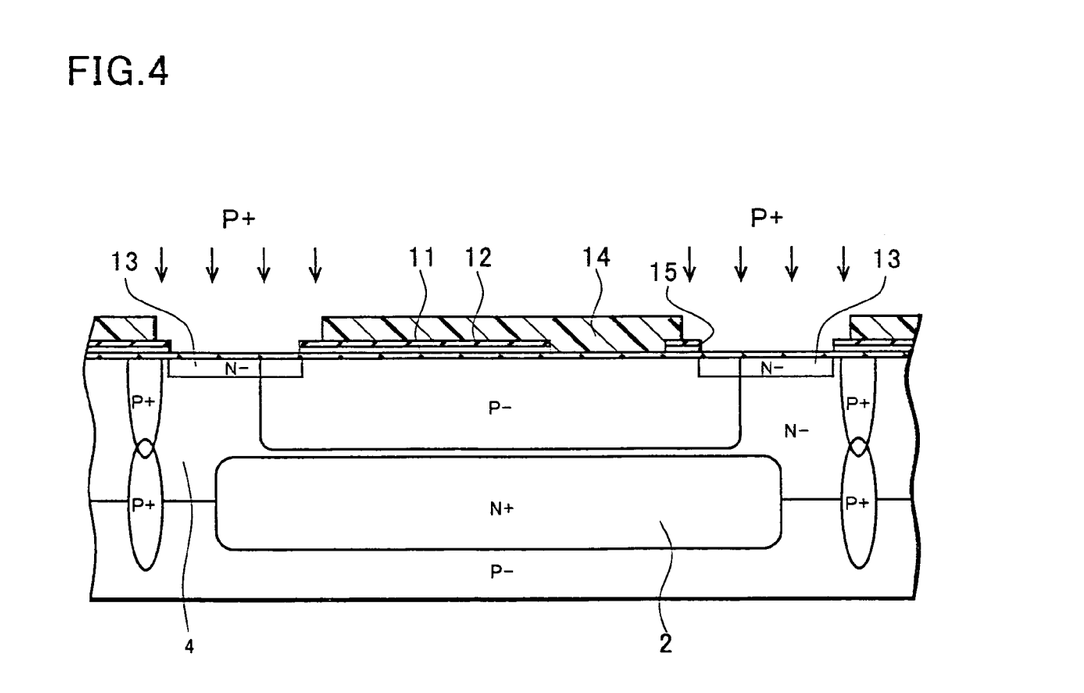
FIG. 4 is a cross-sectional view explaining the method of manufacturing a semiconductor device according to the embodiment of the present invention.

Next, as illustrated in FIG. 4, the polysilicon film 11 and the silicon nitride film 12 are selectively removed in such a manner that an opening is formed on a portion where an LOCOS oxide film 16 (FIG. 5) is formed. After that, on the epitaxial layer 4, there is formed a photoresist 14 for forming an N type diffusion layer 13. Then, an opening is formed on the photoresist 14 placed on an upper surface of a region where the N type diffusion layer 13 is formed by the well known photolithographic technique.

At this time, the N type diffusion layer 13 is formed by the self-alignment technique using an opening 15 for the polysilicon film 11 and the silicon nitride film 12 that are already formed on the epitaxial layer 4. Then, the N type impurity such as phosphorus (P) ions are implanted into an upper surface of the photoresist 14 to form the N type diffusion layer 13. This manufacturing method allows the N type diffusion layer 13 to be formed with a high accuracy of position to the LOCOS oxide film 16 by this manufacturing method.

Figure 5:
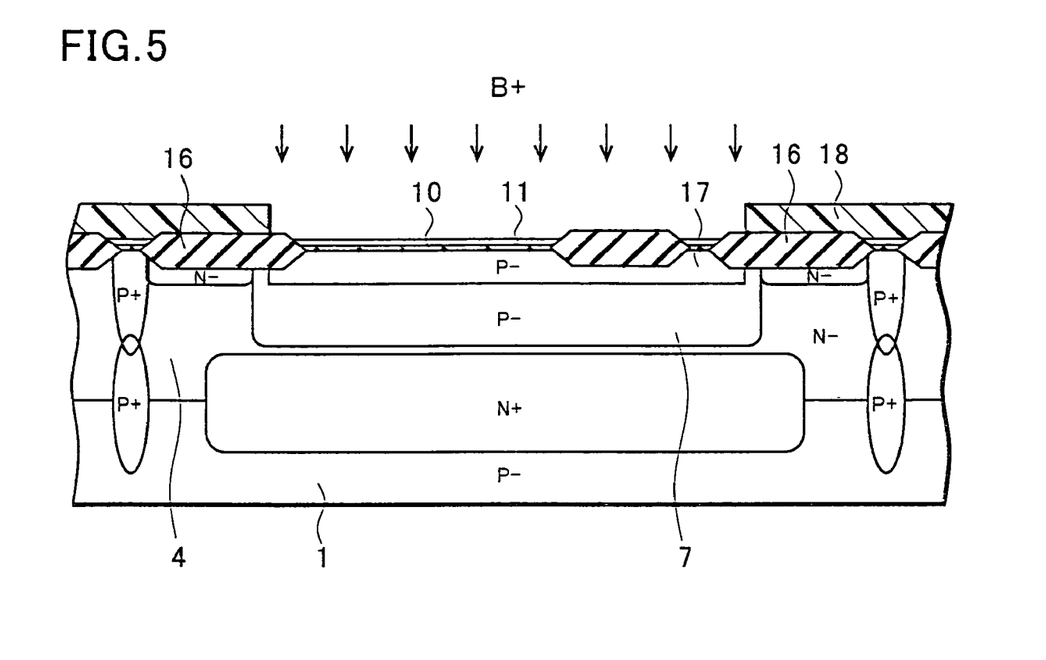
FIG. 5 is a cross-sectional view explaining the method of manufacturing a semiconductor device according to the embodiment of the present invention.

Next, as illustrated in FIG. 5, the LOCOS oxide film 16 is formed on the epitaxial layer 4 using the opening 15. After that, the silicon nitride film 12 is removed and a photoresist 18 for forming a P type diffusion layer 17 is formed on the epitaxial layer 4. An opening is formed on the photoresist 18 on a region where the P type diffusion layer 17 is formed by the well known photolithographic technique. Then, the P type impurity, for example, boron (B) ions are implanted to form the P type diffusion layer 17.

At this time, in the present embodiment, boron (B) ions are implanted at an acceleration voltage of 140 to 180 keV and with a dose of $1.0 \times 10^{11}$ to $1.0 \times 10^{13}/cm^2$. Then, an implantation of ions is performed in such a manner that the peak of the impurity concentration of the P type diffusion layer 17 exists closer to a surface of the epitaxial layer 4 than the peak of the impurity concentration of the P type diffusion layer 7. After that, the photoresist 18 is removed, and thereafter implanted impurity ions are diffused. According to this manufacturing method, a backgate region formed by the P type diffusion layers 7 and 17 has a gradual concentration profile although explained later using FIG. 9A.

Figure 6:
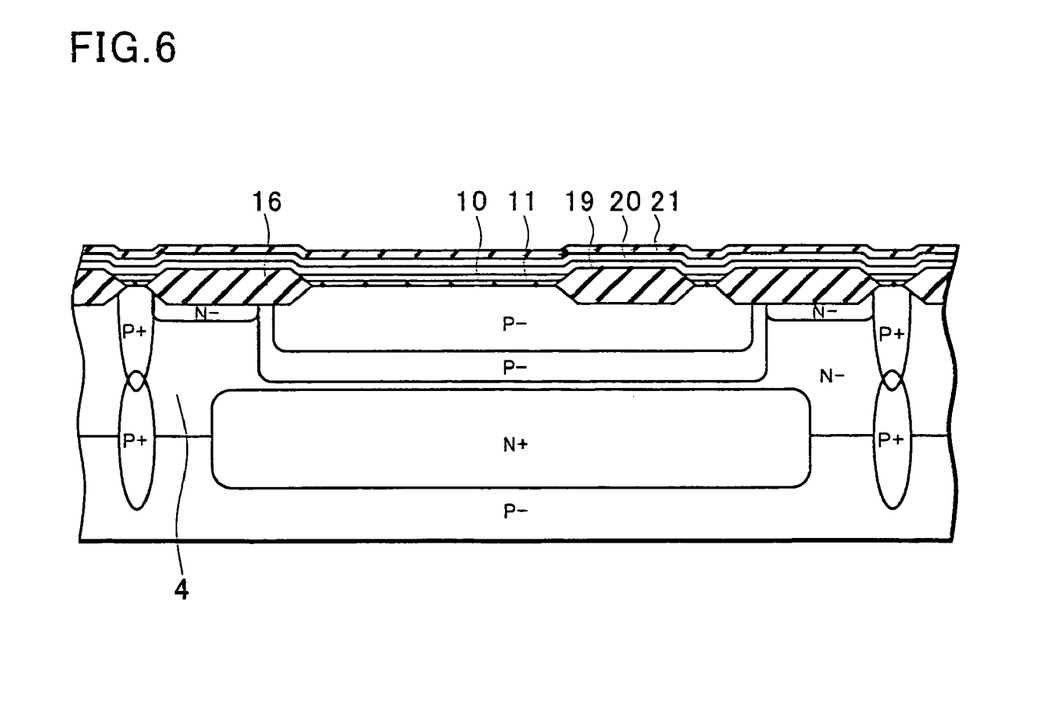
FIG. 6 is a cross-sectional view explaining the method of manufacturing a semiconductor device according to the embodiment of the present invention.

Next, as illustrated in FIG. 6, a polysilicon film 19, a tungsten silicon film 20 and a silicon oxide film 21 are sequentially deposited on the upper surface of the epitaxial layer 4 in such a way to cover the residual silicon oxide film 10 and polysilicon film 11. At this time, the silicon oxide film 10 left on the surface of the epitaxial layer 4 is used as a gate oxide film. Also, the polysilicon film 19 and the tungsten silicon film 20 are deposited on an upper surface of the residual polysilicon film 11 to serve as a desired film thickness for the gate electrode.

Namely, in the present embodiment, both the silicon oxide film 10 as the gate oxide film and the polysilicon film 11 as the gate electrode are also used as a mask in forming the LOCOS oxide film 16. This manufacturing method makes it possible to omit a process for depositing and removing the silicon oxide film used in forming the LOCOS oxide film 16, simplify a manufacturing process, and suppress a manufacturing cost.

Figure 7:
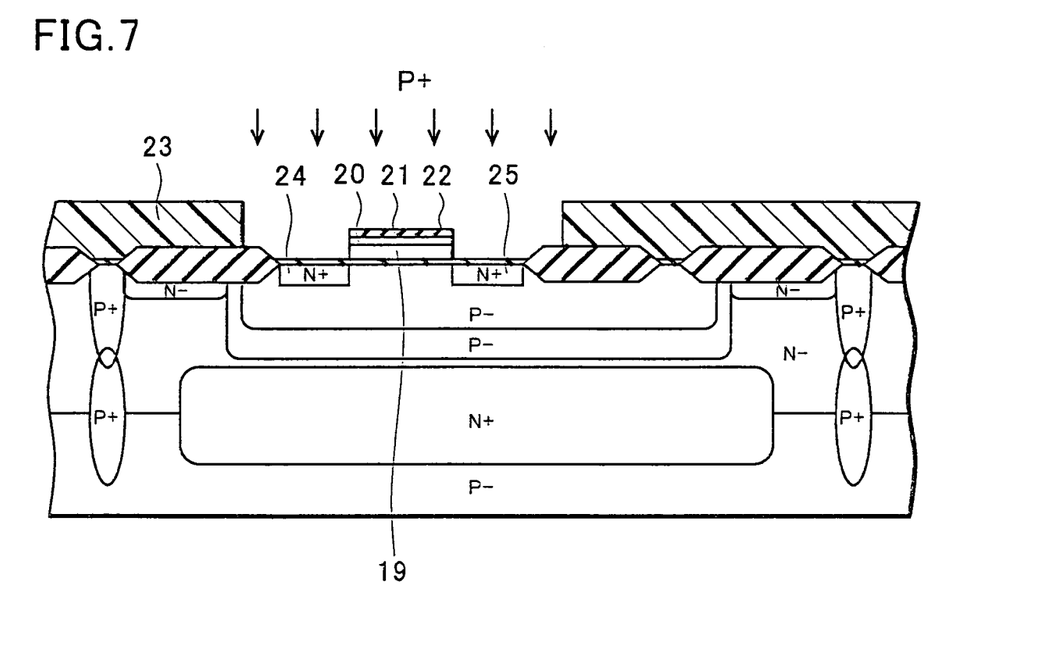
FIG. 7 is a cross-sectional view explaining the method of manufacturing a semiconductor device according to the embodiment of the present invention.

Moreover, after forming the silicon oxide film 10, the polysilicon film 11 is deposited on its upper surface, thereby making it possible to protect the silicon oxide film 10 by the polysilicon film 11. Then, the thickness of the silicon oxide film 10 is maintained in a range suitable for use as the gate oxide film. In FIG. 7 and afterward, the polysilicon film 11 and the polysilicon film 19 are illustrated as one body.

Next, as illustrated in FIG. 7, the polysilicon film 19 and the like are selectively removed in such a manner that the polysilicon film 19, the tungsten silicon film 20 and the silicon oxide film 21 of the region used as a gate electrode 22. After that, a photoresist 23 is deposited. The N type impurity such as phosphorus (P) ions are implanted to form N type diffusion layers 24 and 25 by the well known photolithographic technique. The N type diffusion layer 24 is used as a source region and the N type diffusion layer 25 is used as a drain region. As illustrated in the figure, the N type diffusion layers 24 and 25 are formed by the self-alignment technique using the LOCOS oxide film 16 and the gate electrode 22.

At this time, in the present embodiment, after phosphorus (P) ions are implanted, the photoresist 23 is removed and a heat treatment is performed for about, e.g., one hour to diffuse phosphorus (P). Then, as illustrated by a circle 39 in FIG. 8, the N type diffusion layer 25 placed at the lower portion of the gate electrode 22 is diffused while being expanded to the source region side. More specifically, the N type diffusion layer 25, serving as the drain region, is formed in order that an angle formed by a tangent line of the N type diffusion layer 25 and the surface of the epitaxial layer 4 gets smaller toward the surface. In other words, the N type diffusion layer 25 is formed in a y shape at the lower portion of the gate electrode 22. This diffusion shape results in that the N type diffusion layer 25 has a wider low impurity concentration region at the lower portion of the gate electrode 22. It is noted that the N type diffusion layer 24, serving as the source region, is also formed in a y shape at the lower portion of the gate electrode 22 in the similar way.

Figure 8:
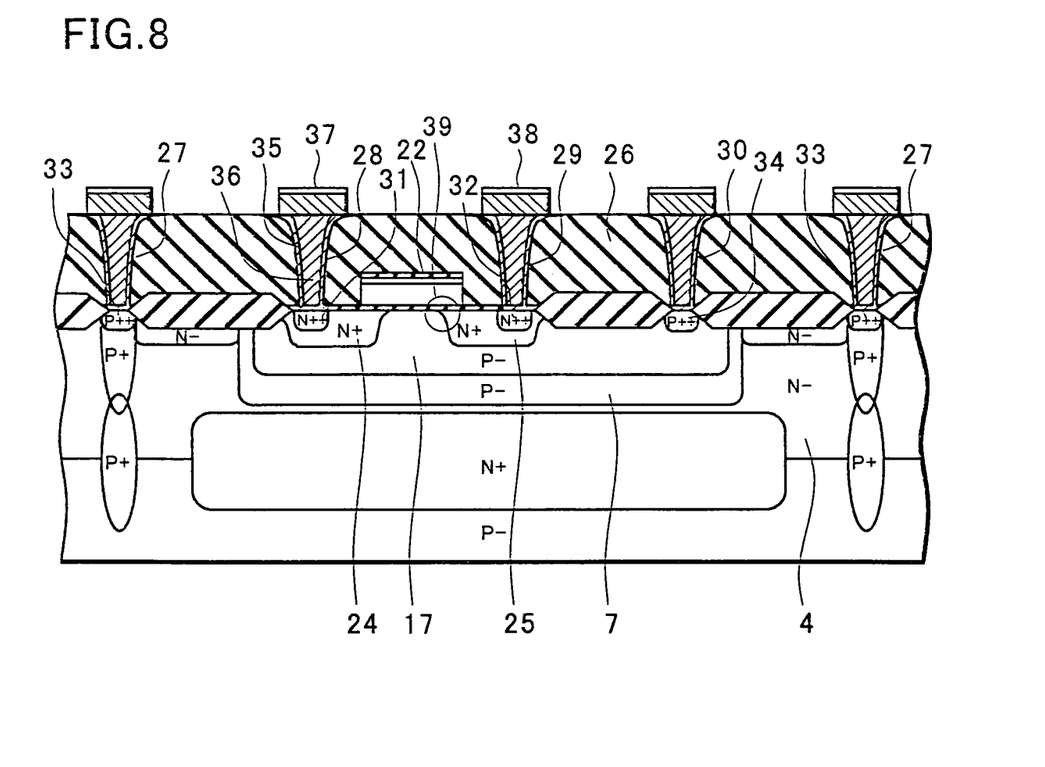
FIG. 8 is a cross-sectional view explaining the method of manufacturing a semiconductor device according to the embodiment of the present invention.

Finally, as illustrated in FIG. 8, an insulation layer 26 such as a BPSG (Boron Phospho Silicate Glass) film, an SOG (Spin On Glass) film, etc., is deposited on the epitaxial layer 4. Then, contact holes 27, 28, 29 and 30 are formed on the insulation layer 26 by, for example, dry-etching with a $CHF_3 + O_2$ gas using the well known photolithographic technique.

Next, N type diffusion layers 31 and 32 are formed by the well known photolithographic technique. Also, P type diffusion layers 33 and 34 are formed in the similar way. At this time, the use of the contact holes 27, 28, 29 and 30 makes it possible to form these layers with a high accuracy of position. The N type diffusion layers 31 and 32 serve as impurity regions having higher impurity concentrations than those of the N type diffusion layers 24 and 25, respectively. The source and drain regions having a DDD structure are formed by this manufacturing method.

Next, a barrier metal layer 35 is formed on inner walls of the contact holes 27, 28, 29 and 30. After that, the contact holes 27, 28, 29 and 30 are buried with a tungsten (W) film 36. Then, an aluminum copper (AlCu) film and the barrier metal film are deposited on the W film 36 by a CVD method. After that, the AlCu film and the barrier metal film are selectively removed to form a source electrode 37 and a drain electrode 38 by the well known photolithographic technique. It is noted that a wiring layer to the gate electrode is not illustrated in a cross section shown in FIG. 8; however, connection to the wiring layer is made in the other regions.

Figure 9A:
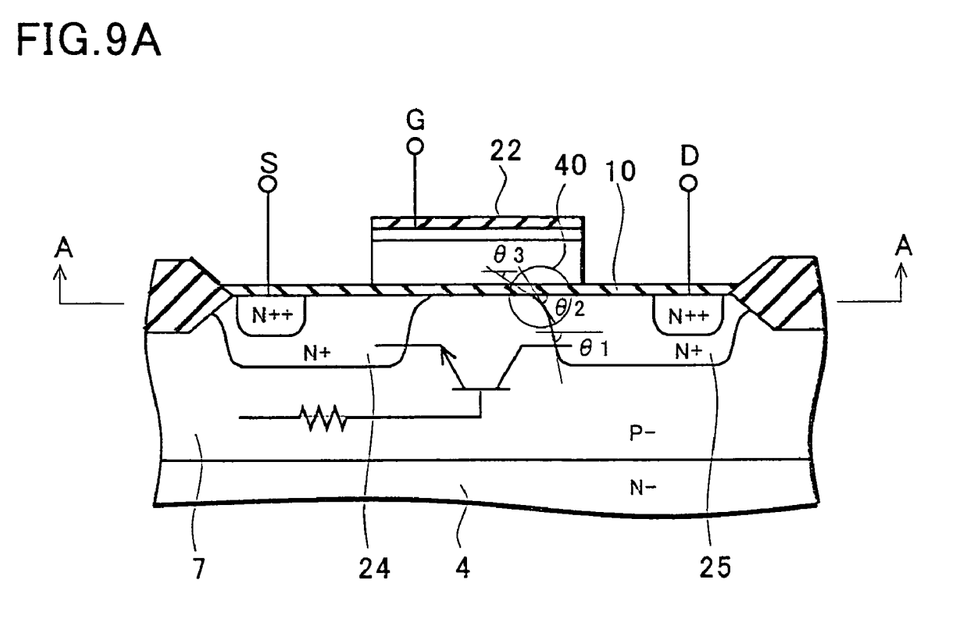
FIG. 9A is a cross-sectional view for explaining a drain region and its vicinity region of the semiconductor device according to the embodiment of the present invention.
Figure 9B:
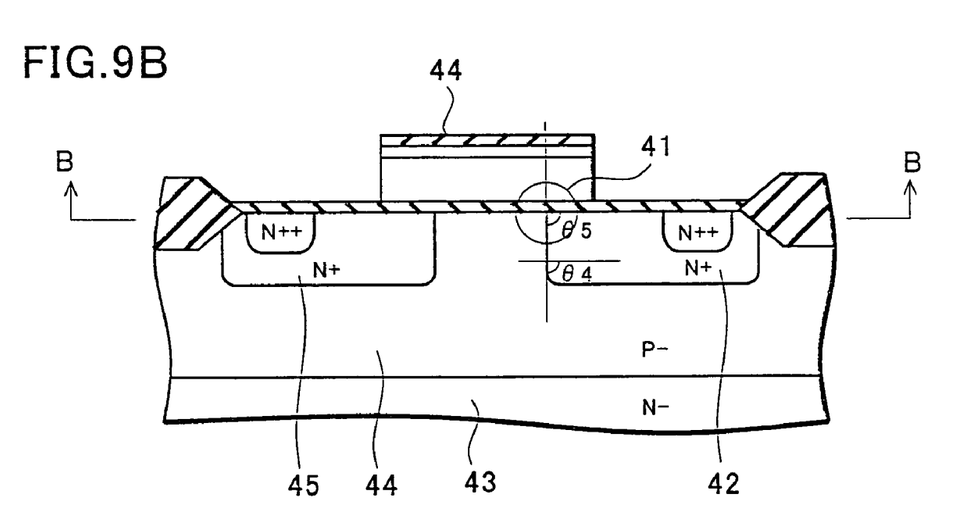
FIG. 9B is a cross-sectional view for explaining a drain region and its vicinity region of a semiconductor device according to a conventional embodiment.
Figure 10A:
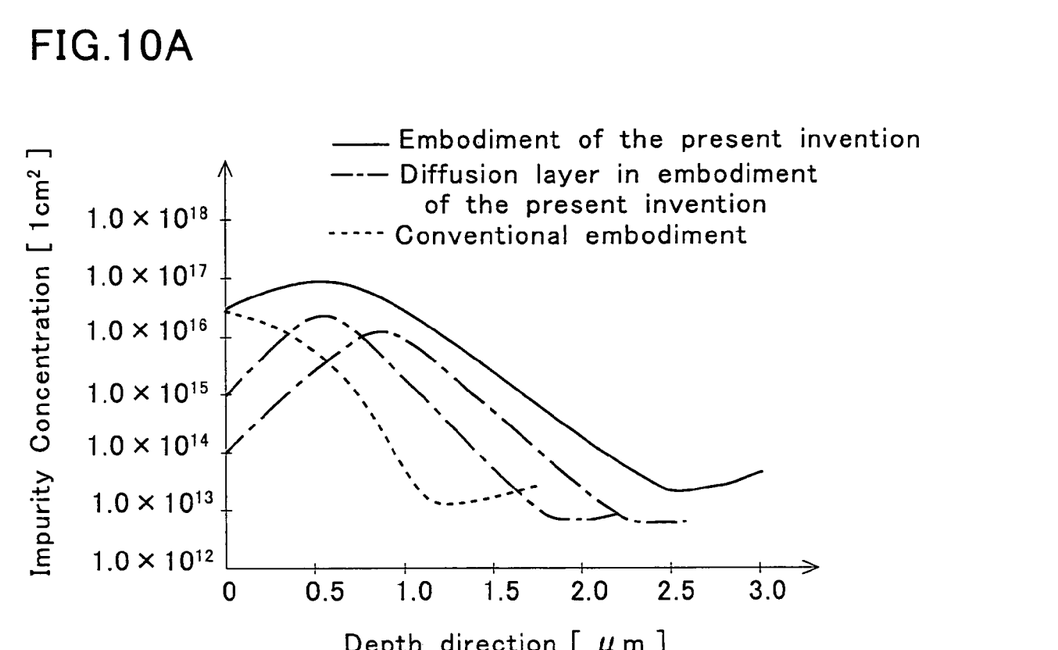
FIG. 10A is a view for explaining a concentration profile of a backgate region and FIG. 10B is a view for explaining a concentration profile of a drain region in connection with the semiconductor device of each of the embodiment of the present invention and the conventional embodiment.
Figure 10B:
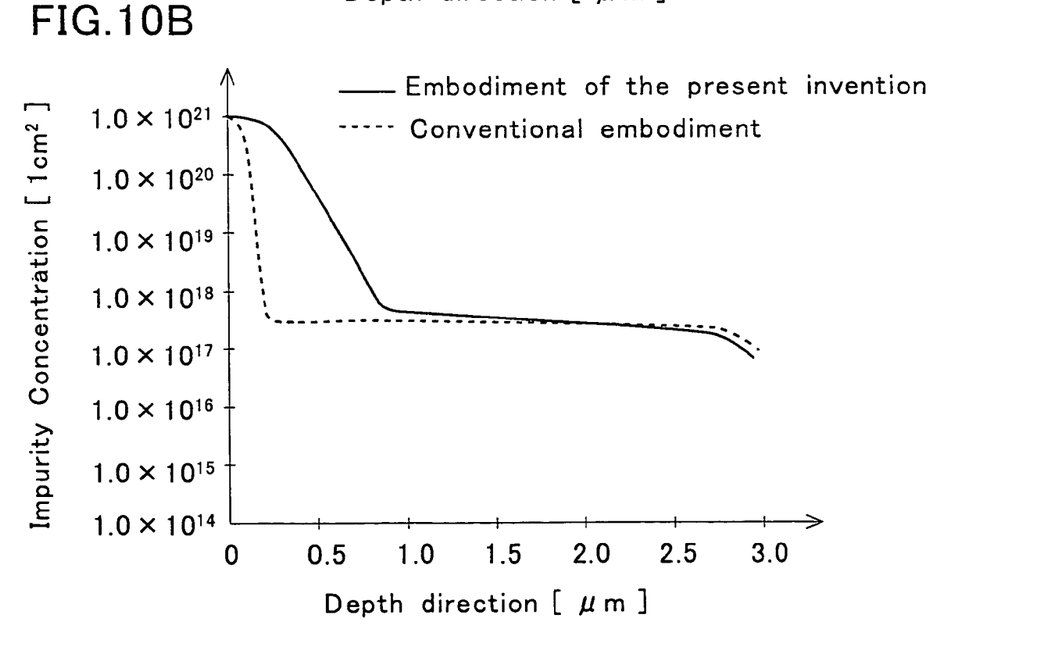
Figure 11:
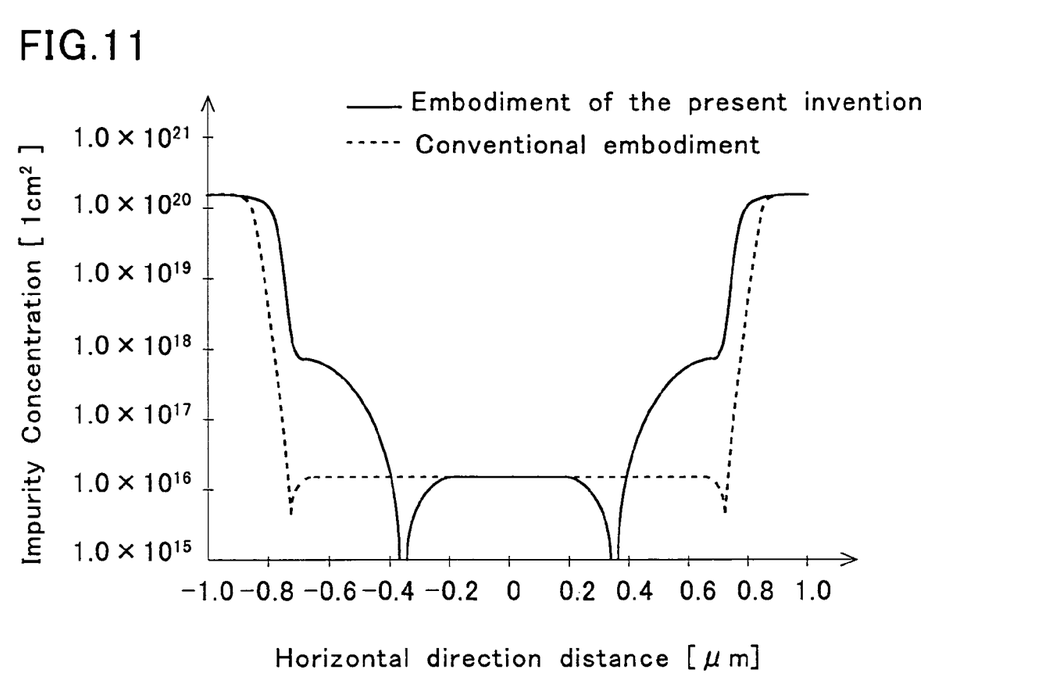
FIG. 11 is a view for explaining a concentration profile of the semiconductor device of the present embodiment at a cross section taken along a line A-A shown in FIG. 9A and that of the conventional semiconductor device at a cross section taken along a line B-B shown in FIG. 9B.
Figure 12A:
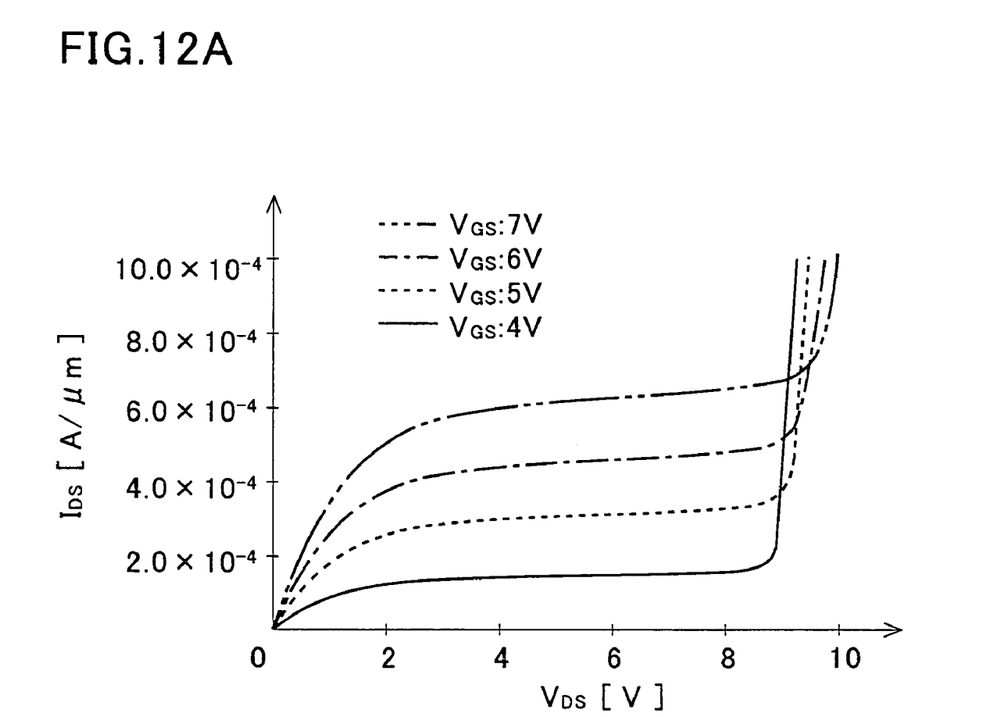
FIG. 12A is a view explaining a relationship between a current value between a drain and a source and a withstand voltage characteristic of the semiconductor device according to the embodiment of the present invention and FIG. 12B is a view explaining a relationship between a current value between a drain and a source and a withstand voltage characteristic of the semiconductor device according to the conventional embodiment.
Figure 12B:
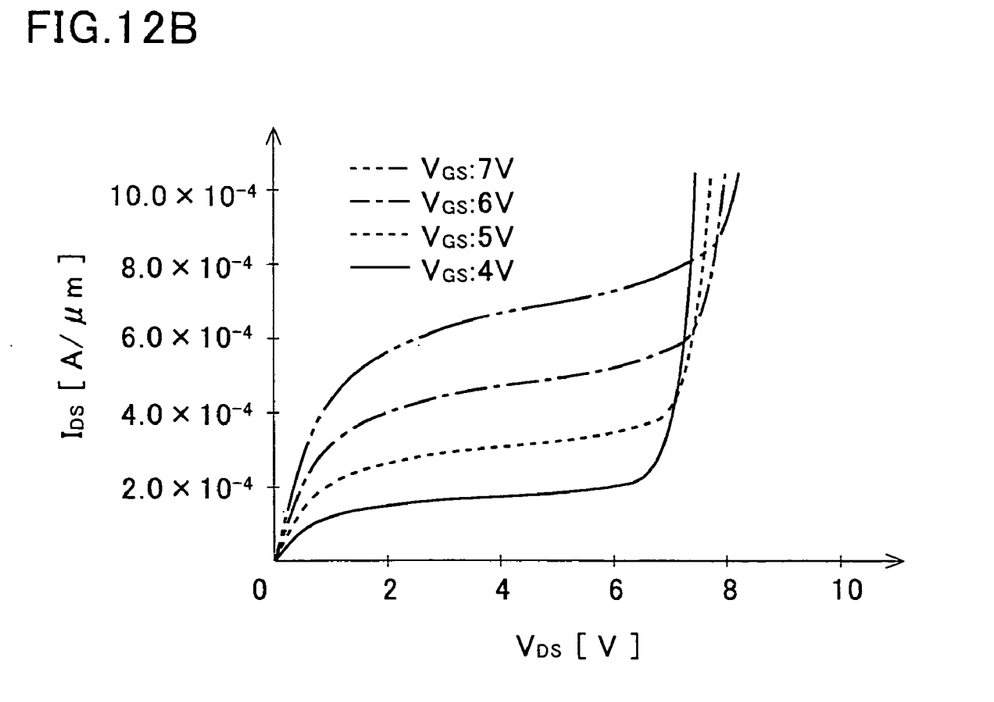
Figure 13:
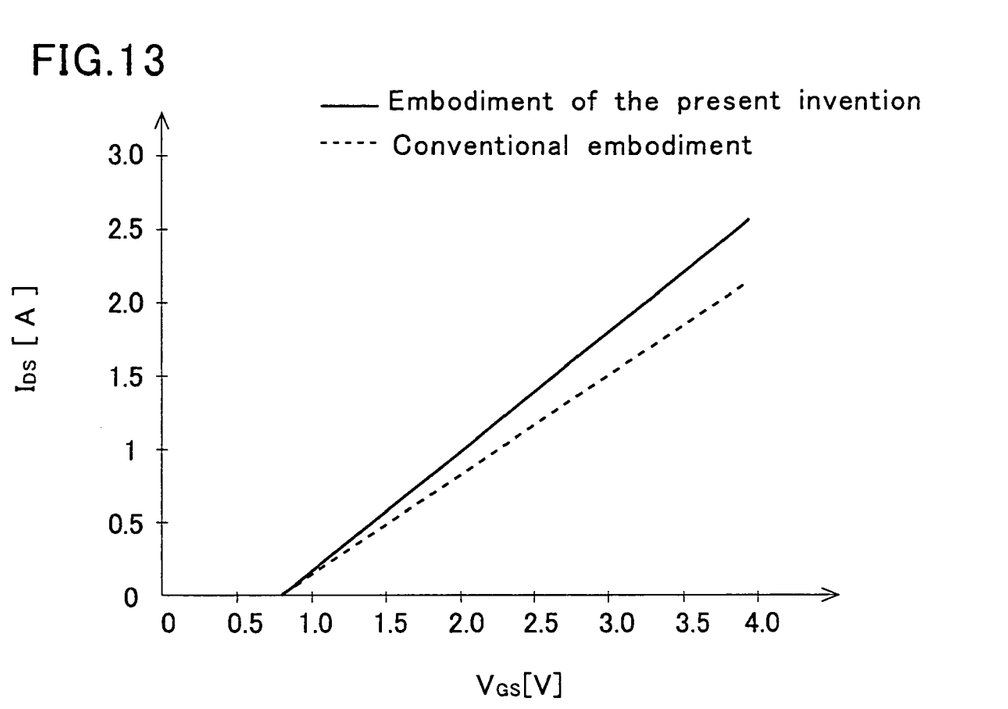
FIG. 13 is a view explaining a current capability in each of the embodiment of the present invention and the conventional embodiment.

An explanation will be next given of the semiconductor device formed by the aforementioned manufacturing method with reference to FIGS. 9 to 13. FIG. 9A is a cross-sectional view for explaining a drain region and its vicinity region of the semiconductor device according to the present embodiment. FIG. 9B is a cross-sectional view for explaining a drain region and its vicinity region of a conventional semiconductor device. FIG. 10A is a view for explaining a concentration profile of a backgate region of the semiconductor device of the present embodiment and that of the conventional semiconductor device. FIG. 10B is a view for explaining a concentration profile of a drain region of the semiconductor device of the present embodiment and that of the conventional semiconductor device. FIG. 11 is a view for explaining a concentration profile of the semiconductor device of the present embodiment at a cross section taken along a line A-A shown in FIG. 9A and that of the conventional semiconductor device at a cross section taken along a line B-B shown in FIG. 9B. FIG. 12A is a view explaining a withstand voltage characteristic of the semiconductor device according to the embodiment of the present invention. FIG. 12B is a view explaining a withstand voltage characteristic of the semiconductor device according to the conventional embodiment. FIG. 13 is a view explaining a current capability in each of the semiconductor device of the present embodiment and the conventional semiconductor device. Additionally, in FIG. 9A, the same reference numerals as those illustrated in FIGS. 1 to 8 are added to the same structural elements as those illustrated in FIGS. 1 to 8.

As illustrated in FIG. 9A, according to the present embodiment, in the N-type diffusion layer 25 used as the drain region, the diffusion layer expands from the deeper portion of the epitaxial layer 4 to the surface. More specifically, the N type diffusion layer 25 is formed in order that angles θ, each being formed by a tangent line of the N type diffusion layer 25 and the surface of the epitaxial layer 4, get smaller toward the surface. As illustrated in the figure, the N type diffusion layer 25 is formed in such a manner that the angles, each being formed by the tangent line of the N type diffusion layer 25 and the surface of the epitaxial layer 4, become θ1>θ2>θ3. Then, the N type diffusion layer 25 is directed to the N type diffusion layer 24 to converge onto the surface of the epitaxial layer 4 at the lower portion of the gate electrode 9. In other words, the N type diffusion layer 25 shown by a circle 40 is diffused in a y shape after changing its curvature. It is noted that the N type diffusion layer 24, serving as the source region, is also diffused in a y shape in the similar way.

As illustrated in FIG. 9B, in conventional, an N type diffusion layer 42 shown by a circle 41 is diffused in such a manner that its curvature is substantially unchanged in an N-channel type MOS transistor structure. More specifically, angles θ, each being formed by a tangent line of the N type diffusion layer 42 and a surface of an epitaxial layer 43, are substantially equal as respective positions on the tangent line get smaller toward the surface. Or, the angles θ are slightly increased or reduced depending on manufacturing conditions such as a diffusion time and the like. For example, angles θ, each being formed by the tangent of the N type diffusion layer 42 and the surface of the epitaxial layer 43, become θ4≈θ5.

An explanation will be next given of the reason why the structure shown in FIG. 9A is formed using FIG. 10. In FIG. 10, a solid line shows a concentration profile of a backgate region in the present embodiment. Dashed-dotted lines show concentration profiles of the diffusion layers 7 and 17 that form the backgate region in the present embodiment. A dotted line shows a concentration profile of a conventional backgate region.

As shown in FIG. 10A, the backgate region of the present embodiment is formed in such a manner that the peak of the impurity concentration exists in a region of about 0.6 μm from the surface of the epitaxial layer 4. Under a condition that the peak of the impurity concentration of the P type diffusion layer 17 exists closer to the surface than the peak of the impurity concentration of the P type diffusion layer 7, an implantation of ions and diffusion are performed to form this region. Then, the P type diffusion layers 7 and 17 are formed in a way that the diffusion layers are overlapped on each other to realize the concentration profile as illustrated in the figure. On the other hand, in the conventional backgate region, a P type diffusion layer 44 is formed in such a manner that the peak of the impurity concentration exists in the vicinity of the surface of the epitaxial layer 43. It is noted that the P type diffusion layers 7 and 17 are formed in a way that the diffusion layers are overlapped on each other and these layers will be hereinafter explained as the P type diffusion layer 7.

As illustrated in FIG. 10B, in the drain region of the present embodiment, the N type diffusion layer 25 is formed in such a manner that the peak of the impurity concentration exists in the vicinity of the surface of the epitaxial layer 4. Then, the drain region is formed up to the deeper portion of the epitaxial layer 4. On the other hand, in the drain region of the conventional embodiment, the N type diffusion layer 42 is also formed in such a manner that a peak of the impurity concentration exists in the vicinity of the surface of the epitaxial layer 43 in the similar way.

An explanation will be next given of the concentration profile of the drain region using FIG. 11. It is noted that a horizontal axis indicates a separated distance to the drain region side as a positive value and a separated distance to the source region side as a negative value. Moreover, the cross section taken along a line A-A of the present embodiment and the cross section taken along a line B-B of the conventional embodiment are the cross sections of the same region when the same device size is provided.

As illustrated in the figure, the concentration profile at the cross section taken along a line A-A of the present embodiment shows that the impurity concentrations of the N type diffusion layers 24 and 25 gradually increase in a range from a region separated by about 0.3 (μm) from the center of the gate electrode 22 to a region separated by about 0.7 (μm) therefrom. Then, the impurity concentrations sharply increase after the region separated by about 0.7 (μm) from the center of the gate electrode 22. On the other hand, the concentration profile at the cross section taken along a line B-B of the conventional embodiment shows that the impurity concentrations of the N type diffusion layers 42 and 45 sharply increase after the region separated by about 0.7 (μm) from the center of the gate electrode 44.

In other words, the N type diffusion layers 24 and 25, serving as the source region or drain region, of the present embodiment are formed to have a structure in which the low concentration diffusion region expands to the center of the gate electrode 22 in the vicinity of the surface of the epitaxial layer 4. According to this structure, the gate oxide film 10 is formed to have a thickness of, for example, 50 to 340 (Å), thereby making it possible to improve the electric field relaxation by the low concentration region of the drain region although a vertical electric field from the gate electrode is increased. Moreover, a channel direction electric field directing from the source region to the drain region becomes maximum at the end portion of the drain region. In connection with the channel direction electric field, the aforementioned structure makes it possible to improve the electric field relaxation by the low concentration region of the drain region in the same way.

Finally, an explanation will be given of an effect resulting from the provision of the structure having the concentration profiles explained in FIGS. 10 and 11, with reference to FIGS. 12 and 13.

FIG. 12A illustrates a withstand voltage characteristic in the structure of the present embodiment shown in FIG. 9 A. FIG. 12B illustrates a withstand voltage characteristic in the conventional structure shown in FIG. 9 B. As illustrated in FIG. 9A, a parasitic NPN transistor, formed of the N type diffusion layers 24, 25 and the P type diffusion layer 7, is turned on in response to an ON-operation of an N channel MOS transistor.

Here, the parasitic NPN transistor is turned on by the following two operations. First, a free carrier (hole), which is to be paired with a free carrier (electron), is generated in the N type diffusion layer 25 by an impact ionization caused by a high electric field in the vicinity of the drain region at a lower portion of the gate electrode 22. Then, the free carrier (hole) flows into the P type diffusion layer 7 and is biased between an emitter and a base of the parasitic NPN transistor in a forward direction, so that the parasitic NPN transistor is turned on in some cases. Next, when the N type diffusion layer 25, serving as the drain region, is formed of a shallow diffusion layer, an electron current density in the N type diffusion layer 25 is increased, so that the free carrier (hole) is likely to occur. Then, the free carrier (hole) occurred in the N type diffusion layer 25 flows into the P type diffusion layer 7 and is biased between the emitter and the base of the parasitic NPN transistor in a forward direction, so that the parasitic NPN transistor is turned on in some cases.

As mentioned above, according to the present embodiment, the N type diffusion layer 25, serving as the drain region, is diffused to the lower portion of the gate electrode 22 and the diffusion region is a low concentration region. Then, the electric field in the drain region is relaxed to suppress generation of the impact ionization and to prevent occurrence of the free carrier (hole) at the time of an ON-operation of the MOS transistor. Moreover, the diffusion depth of the N type diffusion layer 25, serving as the drain region, is increased to enlarge a channel of the free carrier (electron). Then, an electron current density is reduced at the N type diffusion layer 25 to prevent occurrence of the free carrier (hole) at the time of the ON-operation of the MOS transistor. As a result, the On-operation of the parasitic NPN transistor is suppressed to improve the withstand voltage characteristic at the time of the ON-operation of the MOS transistor.

More specifically, as illustrated in FIG. 12A, in the structure of the present embodiment, a source-drain voltage of up to about 8 (V) can be used. Moreover, a slope angle becomes flat or near flat, so that a stable drive performance can be obtained in the range of about 2 (V) to about 8 (V) of the source-drain voltage although there are a slight difference depending on magnitude of the gate-source voltage.

On the other hand, as illustrated in FIG. 12B, in the structure of the conventional embodiment, a source-drain voltage of up to about 6 (V) can be used. However, as compared with FIG. 6A, the withstand voltage characteristic deteriorates by about 2 (V). Moreover, a slope angle becomes gentle in the range of about 2 (V) to about 6 (V) of the source-drain voltage although there are a slight difference depending on magnitude of the gate-source voltage. However, as compared with FIG. 6A, the slope angle does not become flat or near flat, so that a hot carrier is likely to occur, thereby making it difficult to obtain a stable drive performance.

As illustrated in FIG. 13, the structure of the present embodiment improves a current capability as compared with the structure of the conventional embodiment. This is because the N type diffusion layers 24 and 25, serving as the source region and the drain region, are diffused to the central portion of the gate electrode 22 to shorten a channel length as explained using FIG. 11. In other words, particularly, in the drain region to which a high voltage is applied, the N type diffusion layer 25, which forms a channel region and a PN junction region, is a low concentration diffusion region. This enables a depletion layer to expand to the drain region side and improve the current capability as maintaining a desired withstand voltage characteristic.

Moreover, in the present embodiment, the drain region is formed to have the DDD structure, thereby making it possible to omit the process for forming a spacer insulation film on the side wall of the gate electrode. This makes it possible to reduce the number of masks and that of manufacturing processes to suppress the manufacturing cost. Furthermore, it is possible to simplify the manufacturing process.

Additionally, although the present embodiment has explained the case in which the drain region is formed to have the DDD structure, the embodiment of the present invention is not limited to this case. For example, the embodiment of the present invention may be applied to a case in which the drain region is formed to have a single drain structure. Furthermore, although the present embodiment has explained the case in which the P type diffusion layers 7 and 17 are formed in forming the backgate region, the embodiment of the present invention is not limited to this case. For instance, in forming the diffusion layer in the drain region, impurities are obliquely implanted and thereafter a thermal treatment is performed, thereby the diffusion structure shown in FIG. 9 may be realized. Furthermore, if a concentration distribution is one that can implement the diffusion structure of the drain region explained using FIG. 9, an arbitrary design change in the diffusion structure of the backgate region may arbitrarily possible. Moreover, the embodiment of the present invention may be applied to a case in which a structure in which a polysilicon film and a metal film such as a tungsten film are layered is used as the gate electrode. In addition, various modifications can be made without departing from the scope of the embodiment of the invention.

In the embodiment of the present invention, a backgate region is formed in such a way to have a peak of the impurity concentration located at a deeper portion. The drain region is formed to be widely diffused with respect to the backgate region as it approaches to the surface of the semiconductor layer. This manufacturing method can form the drain region in such a manner that the impurity concentration becomes low at a lower portion of the gate electrode. Then, a vertical-direction electric field from the gate electrode and a channel-direction electric field can be relaxed in the drain region while reducing the number of masks and that of manufacturing processes to suppress the manufacturing cost.

Moreover, according to the embodiment of the present invention, the diffusion layers are formed in a way that the diffusion layers are overlapped on each other, thereby forming the backgate region having the concentration profile in which the impurity concentration reaches the peak at the deeper portion and gradually decreases as it approaches to the surface of the semiconductor layer. This manufacturing method can form the drain region that is widely diffused as it approaches to the surface of the semiconductor layer.

Furthermore, according to the embodiment of the present invention, a drain region and a source region are formed by use of the gate electrode as a mask. This manufacturing method can form a low concentration region of the drain region and that of the source region at a lower portion of the gate electrode. Then, it is possible to improve a current capability as maintaining a withstand voltage characteristic of a semiconductor device.

Still furthermore, according to the embodiment of the present invention, the gate oxide film is formed to have a thickness of 50 to 340 Å. This manufacturing method enables an operation to be performed at a low driving voltage.

What is claimed is:

1. A method of manufacturing a semiconductor device, comprising the steps of:
    forming a backgate diffusion layer on a semiconductor layer, including
        forming a first diffusion layer, having a peak of an impurity concentration located at a deeper portion of the semiconductor layer, and
        forming at least one second diffusion layer, having a peak of an impurity concentration located closer to the surface of the semiconductor layer than the peak of the impurity concentration of the first diffusion layer, wherein the first and second diffusion layers are overlapped and wherein the second diffusion layer extends essentially completely within the first diffusion layer in direction of depth of the semiconductor layer;
    forming a gate oxide film and a gate electrode on the semiconductor layer; and
    forming a source diffusion layer and a drain diffusion layer by implanting impurity ions into the backgate diffusion layer and thereafter diffusing the impurity ions,
        wherein the drain diffusion layer is formed such that the drain diffusion layer has a slope relative to a surface of the semiconductor layer and an angle is formed between a tangent line to the slope and the surface of the semiconductor layer, which angle gets smaller toward the surface of the semiconductor layer.

2. The method of manufacturing a semiconductor device according to claim 1, wherein in the step of forming the drain diffusion layer, after the second diffusion layer is formed, the drain diffusion layer is formed by use of the gate electrode as a mask.

3. The method of manufacturing a semiconductor device according to claim 1, wherein in the step of forming the gate oxide film, the film is formed to have a thickness of 50 to 340Å.

4. The method of manufacturing a semiconductor device according to claim 1, wherein the first diffusion layer and the second diffusion layer are formed such that the impurity concentration within the backgate diffusion layer increases initially from the surface of the semiconductor layer in direction of increasing depth of the semiconductor layer.

5. The method of manufacturing a semiconductor device according to claim 1, wherein the first diffusion layer and the second diffusion layer are formed by implanting p-type impurities into the semiconductor layer through a same side of the semiconductor layer.

6. The method of manufacturing a semiconductor device according to claim 1, wherein the slope of the drain diffusion layer is given by the shape of a boarder region of the drain diffusion layer within the backgate diffusion layer.

* * * * *